(12) United States Patent
Wu et al.

(10) Patent No.: US 10,810,400 B2
(45) Date of Patent: Oct. 20, 2020

(54) FINGERPRINT IDENTIFICATION MODULE AND PACKAGE STRUCTURE OF FINGERPRINT IDENTIFICATION CHIP

(71) Applicant: SHENZHEN GOODIX TECHNOLOGY CO., LTD., Shenzhen (CN)

(72) Inventors: Baoquan Wu, Shenzhen (CN); Wei Long, Shenzhen (CN); Yuping Liu, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 114 days.

(21) Appl. No.: 16/130,151

(22) Filed: Sep. 13, 2018

(65) Prior Publication Data

US 2019/0012516 A1 Jan. 10, 2019

Related U.S. Application Data

(63) Continuation of application No. PCT/CN2016/104859, filed on Nov. 7, 2016.

(51) Int. Cl.
*G06K 9/00* (2006.01)
*H01L 23/00* (2006.01)
*H01L 23/28* (2006.01)

(52) U.S. Cl.
CPC ........... *G06K 9/00053* (2013.01); *G06K 9/00* (2013.01); *H01L 23/28* (2013.01); *H01L 24/26* (2013.01)

(58) Field of Classification Search
CPC .. G06K 9/00053; G06K 7/14; G06K 9/00013; G06K 9/0004; H01L 2224/48227; G06F 2203/0338
See application file for complete search history.

(56) References Cited

U.S. PATENT DOCUMENTS

2011/0228390 A1* 9/2011 Lin .................. H01L 27/14618
 359/507
2013/0180945 A1* 7/2013 Koitz ................ H01L 21/02063
 216/13

(Continued)

FOREIGN PATENT DOCUMENTS

CN 203674206 U 6/2014
CN 104051366 A 9/2014

(Continued)

*Primary Examiner* — Yuzhen Shen

(57) ABSTRACT

The present application provides a fingerprint identification module and a package structure of a fingerprint identification chip. The fingerprint identification module includes: a fingerprint identification chip and a package structure for packaging the fingerprint identification chip. The package structure leaves a fingerprint sensing region of the fingerprint identification chip exposed, an upper surface of a film layer of the fingerprint sensing region is provided with a protection layer with a predetermined thickness. The protection layer is exposed in the fingerprint sensing region outside the package structure and causes the fingerprint identification chip to have a predefined fingerprint identification distance. The fingerprint identification module and the package structure with a protection layer arranged on the upper surface of the fingerprint identification chip provide sufficient protections for fabrication processes such as downstream module assembly, while ensuring that the fingerprint identification chip has a predefined fingerprint identification distance.

14 Claims, 3 Drawing Sheets

(56) References Cited

U.S. PATENT DOCUMENTS

| | | | |
|---|---|---|---|
| 2013/0307818 A1* | 11/2013 | Pope | G06F 3/044 |
| | | | 345/174 |
| 2015/0243571 A1 | 8/2015 | Tsai et al. | |
| 2016/0371529 A1* | 12/2016 | Bhagavat | G06K 9/00053 |
| 2017/0110416 A1* | 4/2017 | Miao | H01L 23/564 |
| 2018/0047764 A1* | 2/2018 | Deng | G02F 1/134309 |
| 2018/0129848 A1* | 5/2018 | Wang | H01L 23/29 |

FOREIGN PATENT DOCUMENTS

| | | | | |
|---|---|---|---|---|
| CN | 104201116 A | | 12/2014 | |
| CN | 104615979 A | * | 5/2015 | G06K 9/00 |
| CN | 104615979 A1 | | 5/2015 | |
| CN | 204991696 U | | 1/2016 | |
| CN | 105981039 A | | 9/2016 | |
| CN | 105990269 A | | 10/2016 | |
| CN | 206225349 U | | 6/2017 | |

* cited by examiner

US 10,810,400 B2

FINGERPRINT IDENTIFICATION MODULE AND PACKAGE STRUCTURE OF FINGERPRINT IDENTIFICATION CHIP

CROSS-REFERENCE TO RELATED APPLICATIONS

The present application is a continuation of international application No. PCT/CN2016/104859 filed on Nov. 7, 2016, which is hereby incorporated by reference in its entirety.

TECHNICAL FIELD

Embodiments of the present application relate to the technical field of fingerprint identification chips, and in particular, relate to a fingerprint identification module and a package structure of a fingerprint identification chip.

BACKGROUND

Since the mobile terminals are designed to be thinner and thinner, the fingerprint identification chips used in the mobile terminals are also designed to be thinner and thinner. In the conventional packaging of the fingerprint identification chip, for reduction of the thickness thereof, a through-silicon vias (TSV), a trenching process and the like techniques are employed. Even the TSV and the trenching process are combined to the traditional substrate packaging process to package the chip to the substrate. Plastic packaging is practiced by using the line layer of the fingerprint chip as a reference plane. Compared with the original wiring process, the fingerprint sensing region of the fingerprint identification chip is thinned by a plastic package layer, such that the thickness of the fingerprint identification chip upon packaging is greatly reduced.

However, in the fingerprint identification employing this package structure, the fingerprint sensing region may not be effectively protected, and thus may be simply subject to damages during downstream fabrication and assembling of the mobile terminal.

SUMMARY

Embodiments of the present application are intended to provide a fingerprint identification module and a package structure of a fingerprint identification module, which supply protections for fabrication processes such as downstream module assembling and the like of the fingerprint identification chip.

Technical solutions used in embodiments of the present application are as follows:

Embodiments of the present application provide a fingerprint identification module. The fingerprint identification module includes a fingerprint identification chip and a package structure for packaging the fingerprint identification chip. The package structure leaves a fingerprint sensing region of the fingerprint identification chip exposed. An upper surface of a film layer of the fingerprint sensing region has a protection layer with a predetermined thickness. The protection layer is exposed in the fingerprint sensing region outside the package structure and causes the fingerprint identification chip to have a predefined fingerprint identification distance.

Preferably, in any one embodiment of the present application, the fingerprint identification module further includes: a solder ball array electrically connected to an external circuit; the solder ball array is arranged under the fingerprint identification chip and is electrically connected to a through-silicon vias structure of the fingerprint identification chip via a solder pad on a lower surface of the fingerprint identification chip, such that the fingerprint identification chip is electrically connected to the external circuit.

Preferably, in any one embodiment of the present application, a substrate is arranged under the solder ball array, a contact array is arranged under the substrate, and the solder ball array is electrically connected to the external circuit via the contact array.

Preferably, in any one embodiment of the present application, the package structure further includes a plastic package; and the plastic package is arranged on the substrate and surrounds the fingerprint identification chip.

Preferably, in any one embodiment of the present application, an upper surface of the plastic package and an upper surface of the protection layer are in the same horizontal plane.

Preferably, in any one embodiment of the present application, a solder pad is arranged on a lower surface of the fingerprint identification chip; a substrate is arranged under the solder pad; a trench structure causing the fingerprint identification chip to be electrically connected to a circuit on the solder pad is arranged on the fingerprint identification chip; a contact array electrically connected to a peripheral circuit is arranged under the substrate; and the solder pad is electrically connected to the contact array such that the fingerprint identification chip is electrically connected to the peripheral circuit via the contact array.

Preferably, in any one embodiment of the present application, the protection layer is a passivation layer.

Preferably, in any one embodiment of the present application, the passivation layer is an organic passivation layer or inorganic passivation layer having a dielectric function.

Preferably, in any one embodiment of the present application, the passivation layer has a dielectric constant of being greater than 3.

Preferably, in any one embodiment of the present application, the passivation layer is formed by spin coating, spray coating, vapor deposition or mold injection.

Preferably, in any one embodiment of the present application, the passivation layer has a thickness of 10 to 20 μm.

Preferably, in any one embodiment of the present application, a cover is arranged above the passivation layer; the cover is bonded to the passivation layer and used as a working surface for a finger to contact.

Preferably, in any one embodiment of the present application, the cover is bonded to the passivation layer via a resin-based adhesive, and the passivation layer is a high surface energy passivation layer that is adaptive to the resin-based adhesive.

Preferably, in any one embodiment of the present application, the passivation layer is directly used as a working surface for a finger to contact.

Preferably, in any one embodiment of the present application, the fingerprint identification chip includes any one of a bare chip, a wafer chip and a package chip.

Preferably, in any one embodiment of the present application, the package structure includes a chip-exposed package structure, a substrate-type package structure and a frame-type package structure.

Embodiments of the present application provide a package structure of a fingerprint identification chip. The package structure leaves a fingerprint sensing region of the fingerprint identification chip exposed. A protection layer with a predetermined thickness is arranged on an upper surface of a film layer of the fingerprint sensing region. The protection layer protects the fingerprint sensing region exposed outside the package structure and causes the fingerprint identification chip to have a predefined fingerprint identification distance.

With the fingerprint identification module and the package structure of a fingerprint identification module according to embodiments of the present application, based on chip-exposed packaging, by arranging a protection layer on the upper surface of the fingerprint identification chip, sufficient protections are provided for fabrication processes such as downstream module assembling and the like of the fingerprint identification chip while ensuring that the fingerprint identification chip has a predefined fingerprint identification distance.

BRIEF DESCRIPTION OF THE DRAWINGS

To describe technical solutions in embodiments of the present application or in the related art more clearly, drawings needed for the description of the embodiments or the related art are briefly described below. Apparently, the drawings described hereinafter merely illustrate some embodiments of the present application. Persons of ordinary skill in the art may also derive other drawings based on the drawings described herein without any creative effort.

DETAILED DESCRIPTION

To make the objectives, technical solutions and advantages of the embodiments of the present application clearer, the technical solutions according to the embodiments of the present application are clearly and thoroughly described with reference to the accompanying drawings of the embodiments of the present application. The described embodiments are merely exemplary ones, but are not all the embodiments of the present application. Based on the embodiments of the present application, all other embodiments derived by persons of ordinary skill in the art without any creative efforts shall fall within the protection scope of the present application.

The technical solutions of the present application are further described in detail with reference to the specific embodiments.

Figure 1:
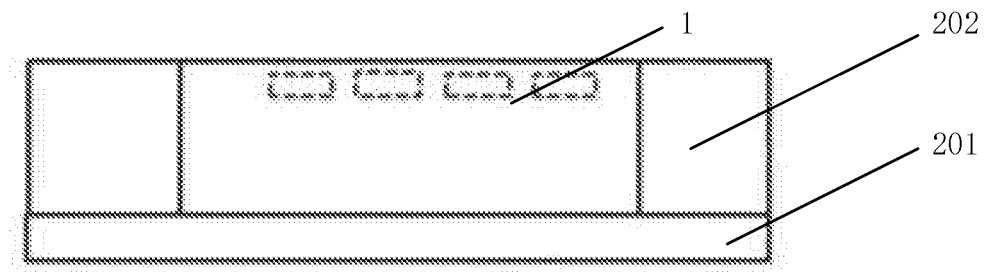
FIG. 1 is a schematic structural view of a fingerprint identification chip and a package structure thereof in the related art.

FIG. 1 is a schematic structural view of fingerprint identification chip and a package structure thereof in the related art. As illustrated in FIG. 1, a package structure of a fingerprint identification chip 1 includes a substrate 201 at the bottom of the fingerprint identification chip 1, and a plastic package 202 surrounding the fingerprint identification chip 1. An upper surface of a fingerprint sensing region 101 of the fingerprint identification chip 1 and an upper surface of the plastic package are in the same horizontal plane, such that the fingerprint sensing region 101 is exposed outside the package structure.

Figure 2:
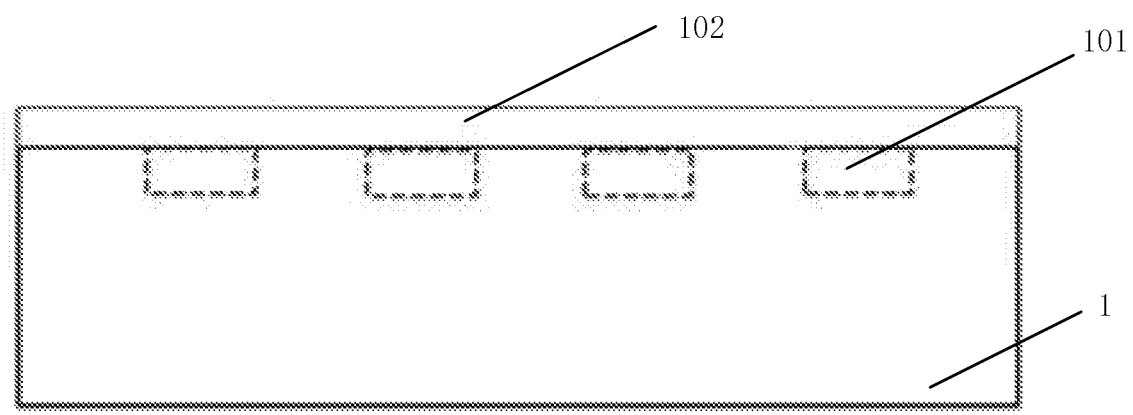
FIG. 2 is a schematic structural view of a fingerprint identification chip in the related art.

Upon completion of chip-exposed packaging, since the fingerprint sensing region of the fingerprint identification chip 1 is exposed outside the package structure, and in such fabrication processes as downstream module assembling and the like, the exposed fingerprint sensing region 101 of the fingerprint identification chip is easily subject to damages, before such fabrication processes as downstream module assembling and the like, sufficient protections are provided for the fingerprint sensing region 101 of the fingerprint identification chip 1. Specifically, a film layer 101 is present on an upper surface of the fingerprint sensing region 101 of the fingerprint identification chip 1 upon fabrication of wafer. As illustrated in FIG. 2, the film layer 102 is generally made from lamination of two materials of silicon dioxide (SiO2) and silicon nitride (Si3N4). The lamination thickness ratio of the two materials may be different depending on the fabricators. However, due to restriction of the manufacture process, generally the total thickness is between 1 and 3 μm. Since the thickness of the film layer 102 is small, the film layer 102 may not provide sufficient protections for the fingerprint sensing region 101 in fabrication processes such as downstream module assembling and the like of the fingerprint identification chip 1.

Figure 3:
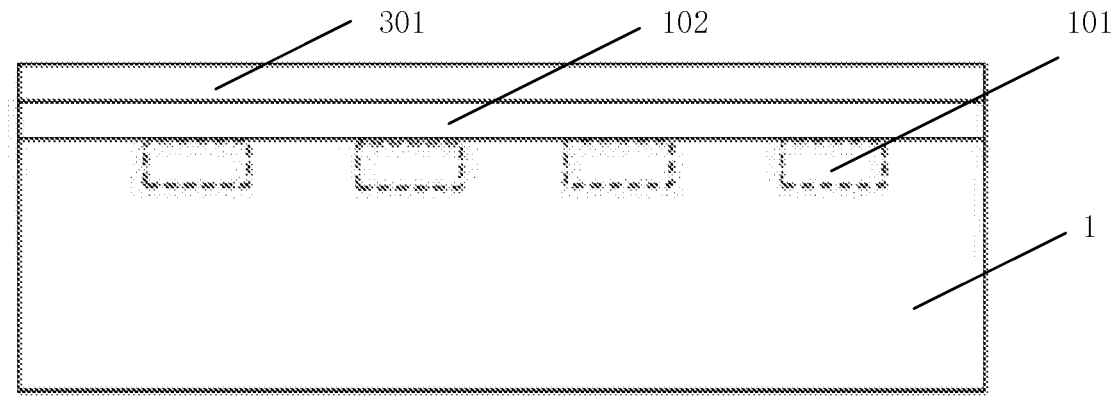
FIG. 3 is a schematic structural view of a fingerprint identification module according to an embodiment of the present application.

In view of the above, an embodiment of the present application provides a fingerprint identification module. As illustrated in FIG. 3, the fingerprint identification module includes a fingerprint identification chip 1 and a package structure for packaging the fingerprint identification chip 1. The package structure leaves the fingerprint sensing region 101 of the fingerprint identification chip 1 exposed. A protection layer 301 with a predetermined thickness is arranged on an upper surface of the film layer 102 of the fingerprint sensing region 101. The protection layer 301 protects the fingerprint sensing region 101 exposed outside the package structure, and enables the fingerprint identification chip 1 to have a predefined fingerprint identification distance.

In the prior art, the film layer on the upper surface of the fingerprint identification chip has a small thickness, and sufficient protections may not be provided for the fabrication processes such as downstream module assembling and the like. Therefore, in this embodiment, the protection layer 301 is arranged on the upper surface of the film layer of the fingerprint identification region 101 to protect the fingerprint sensing region 101 exposed outside during the subsequent fabrication processes, such that the fingerprint sensing region 101 of the fingerprint identification module is not damaged in the fabrication processes such as downstream module assembling and the like. In this way, the fingerprint identification module has good contamination resistance and scratch resistance, and thus the yield rate of the fingerprint identification chip 1 in the fabrication processes such as downstream assembling and the like is improved.

Meanwhile, to ensure that the fingerprint identification chip 1 has a predefined fingerprint identification distance, the thickness of the protection layer 301 is predefined to protect the fingerprint sensing region 101 of the fingerprint identification chip 1 while effective identification of the fingerprint by the fingerprint identification chip 1 is not affected. For example, the thickness of the protection layer 301 may be predefined according to a fingerprint sensing distance of the fingerprint identification chip and material properties of the protection layer 301. If the material properties of the protection layer provide good protections for the fingerprint sensing region 101 of the fingerprint identification chip 1, the predefined thickness of the protection layer 301 may be smaller.

Figure 4:
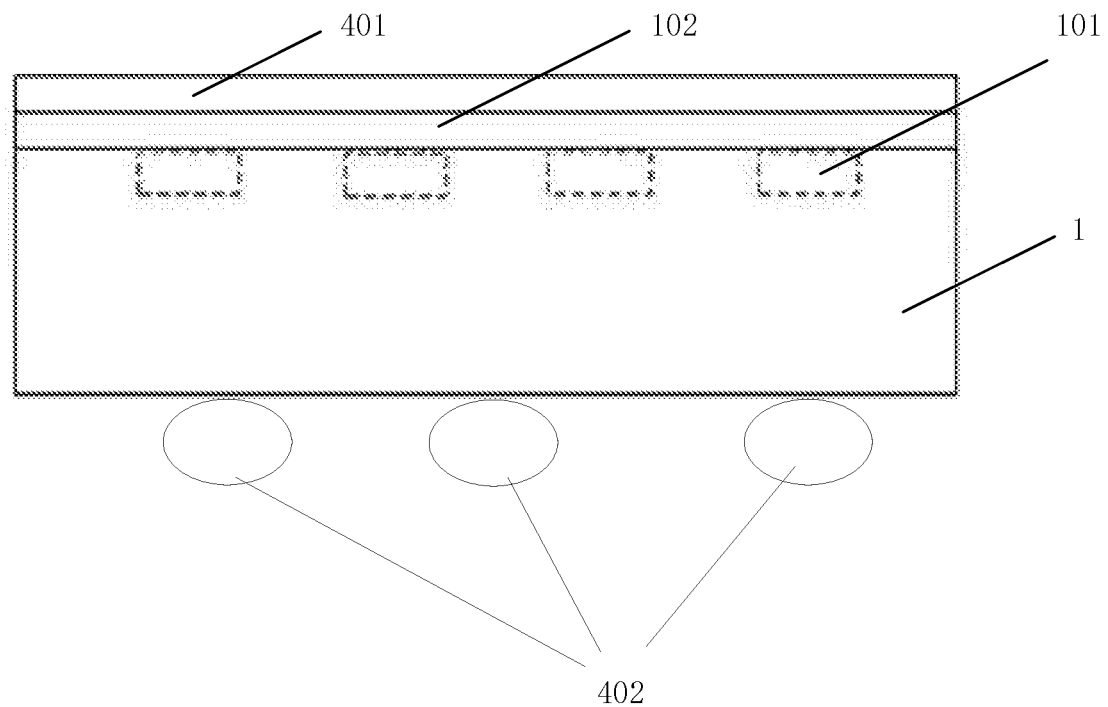
FIG. 4 is a schematic structural view of a fingerprint identification module according to an embodiment of the present application.

Specifically, in another embodiment of the present application, as illustrated in FIG. 4, upon package, the obtained fingerprint identification module not only includes a protection layer 401, but also includes: a solder ball array 402 electrically connected to an external circuit. The solder ball array 402 is arranged under the fingerprint identification chip 1, and is electrically connected to a through-silicon vias structure of the fingerprint identification chip 1 via a solder pad on a lower surface of the fingerprint identification chip 1.

In this embodiment, the solder ball array may be formed by the ball grid array (BGA) process, and the solder balls may be tin balls. The fingerprint identification module is connected to the external circuit via a pin which is the solder ball array 402. Specifically, the solder ball array 402 is of a ball shape, to provide a better heat dissipation for the fingerprint identification chip 1. In addition, the life time of the fingerprint identification chip 1 is prolonged since the solder ball is not subject to deformation and the solder ball array 402 is sufficiently secure.

In this embodiment, inside the fingerprint identification chip 1, a through-silicon vias structure (not illustrated in the drawings) formed by the TSV process is present. In the fingerprint identification chip 1, lines are connected to their desired positions via the through-silicon vias structure. Since the through-silicon vias structure is defined inside the fingerprint identification chip 1 and not exposed outside, the through-silicon vias structure does not need to be additionally protected, such that the package volume of the fingerprint identification chip 1 is effectively reduced.

In the fingerprint identification module according to this embodiment, a solder ball array which may be used as the pin may be additionally arranged on the bottom of the fingerprint identification chip 1. In this way, the obtained fingerprint identification chip 1 has a minimum volume and a minimum thickness.

Figure 5:
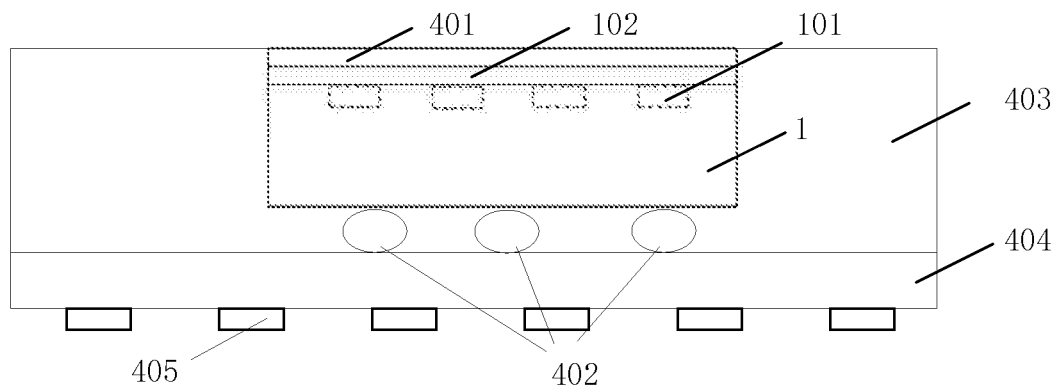
FIG. 5 is a schematic structural view of a fingerprint identification module according to an embodiment of the present application.

Another embodiment of the present application provides a fingerprint identification module. As illustrated in FIG. 5, the fingerprint identification module according to this embodiment is a fingerprint identification module obtained through secondary packaging of the fingerprint chip based on the above embodiment. In the secondary packaging, a substrate or a frame may be additionally arranged under the fingerprint identification chip 1, to package the underneath part of the fingerprint identification chip 1. This embodiment gives description using arranging a substrate 404 as an example.

In this embodiment, the substrate 404 is arranged under the solder ball array 402, and the arranged substrate 404 may provide protections for the underneath part of the fingerprint identification chip 1. A contact array 405 formed by the land grid array (LGA) packaging process is arranged under the substrate 404. The solder ball array 402 is electrically connected to the external circuit via the contact array 405.

Specifically, in this embodiment, the solder ball array 402 is electrically connected to a passageway inside the substrate 404. The passageway inside the substrate 404 electrically connects the solder ball array 402 to the contact array 405, such that the contact array 405 is used as a pin via which the fingerprint identification chip 1 is connected to the external circuit.

In this embodiment, the area of the substrate 404 is greater than the area of the lower surface of the fingerprint identification chip 1. The pins of the fingerprint identification chip 1 may be arranged in many ways, and may be adaptive to different external circuits, so as to improve adaptability of the fingerprint identification chip.

Specifically, in this embodiment, the package structure further includes a plastic package 403. The plastic package 403 is arranged on the substrate 404 and surrounds the fingerprint identification chip 1.

The plastic package 403 may be made from an epoxy molding compound (EMC), and the plastic package 403 surrounds the fingerprint chip and is molded by cross-linking curing, and thus provides protections for the side surface of the fingerprint identification chip 1.

Specifically, theoretically, an upper surface of the plastic package 403 and an upper surface of the protection layer 401 are in the same horizontal plane for the convenience of subsequent processing. However, in the practical process, the protection layer 401 and the plastic package 403 are separately formed on the fingerprint identification chip 1 by different process steps. As a result, the protection layer 401 and the plastic package 403 may not be necessarily in the same horizontal plane. In this case, a height difference between the protection layer 401 and the plastic package 403 may be about 5 μm.

In the fingerprint identification module according to the embodiments of the present application, the package structure of the fingerprint identification chip 1 includes the substrate 404 arranged under the fingerprint identification chip 1, the protection layer 401 arranged on the upper surface of the fingerprint identification chip 1, and the plastic package 403 surrounding the fingerprint identification chip 1. The package structure contains the fingerprint identification chip 1 therein to provide sufficient protections for the fingerprint identification chip 1.

In the fingerprint identification module according to the embodiments of the present application, based on chip-exposed packaging, protections may be provided for the underneath part of the fingerprint identification chip 1 by additionally arranging a protection layer on the upper surface of the fingerprint identification chip and arranging a substrate 404. In this way, the obtained package structure is a substrate-type package structure.

Figure 6:
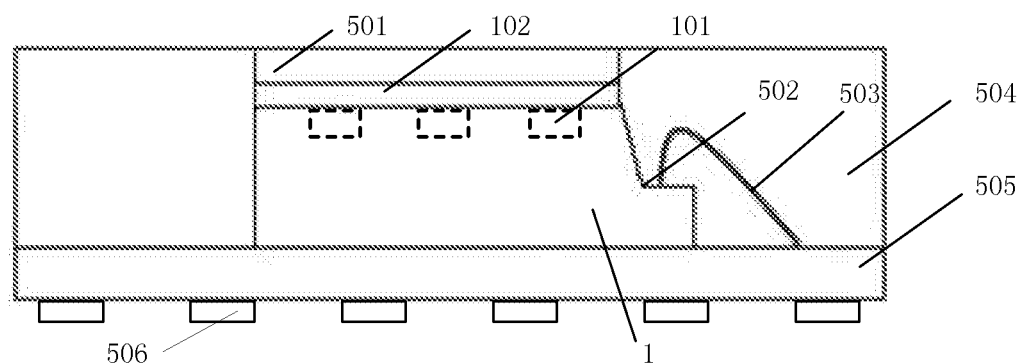
FIG. 6 is a schematic structural view of a fingerprint identification module according to an embodiment of the present application.

An embodiment of the present application further provides a fingerprint identification module. As illustrated in FIG. 6, the fingerprint identification module includes a fingerprint identification chip 1 and a package structure for packaging the fingerprint identification chip 1. The package structure leaves a fingerprint sensing region 101 of the fingerprint identification chip 1 exposed. An upper surface of a film layer of the fingerprint sensing region 101 has a protection layer 501 with a predetermined thickness. The protection layer 501 is exposed in the fingerprint sensing region 101 outside the package structure and causes the fingerprint identification chip 1 to have a predefined fingerprint identification distance.

Specifically, in this embodiment, a solder pad is arranged on a lower surface of the fingerprint identification chip 1; a substrate 505 is arranged under the solder pad; a trench structure 502 causing the fingerprint identification chip to be electrically connected to a circuit on the solder pad is arranged on the fingerprint identification chip; a contact array 506 electrically connected to a peripheral circuit is arranged under the substrate 505; and the solder pad is electrically connected to the contact array 506 such that the fingerprint identification chip 1 is electrically connected to the peripheral circuit via the contact array 506.

The package structure may include the substrate 505 arranged under the fingerprint identification chip 1. The contact array 506 is formed under the substrate 505 via the land grid array (LGA) packaging process. The fingerprint identification chip 1 is electrically connected to the contact array 506, and then electrically connected to a peripheral circuit via the contact array 506.

In this embodiment, a trench structure 502 is formed on a side surface of the fingerprint identification chip 1 by the trenching process, such that the side surface of the fingerprint identification chip 1 has a stage surface. By means of arranging a distribution layer on the trench structure 502, a circuit port on the surface of the fingerprint identification chip 1 is led to the stage surface via the distribution layer, and then is electrically connected to a circuit on the solder pad of the fingerprint identification chip 1 via a metal lead 503. Afterwards, the circuit on the solder pad is electrically connected to the contact array 506 by the redistribution layer (RDL) process.

Specifically, in this embodiment, the lines are connected to their desired positions by the trenching process and the redistribution layer process, and then the protection layer 501 is machined and formed on the surface of the fingerprint sensing region of the fingerprint identification chip 1.

In this embodiment or other embodiments, the protection layer 501 is an organic passivation layer or an inorganic passivation layer having the dielectric function. The passivation layer has a thickness of 10 to 20 μm, and has a dielectric constant of being greater than 3, to reduce the impacts caused by the passivation layer to the fingerprint identification chip.

The passivation layer is formed by spin coating, spray coating, vapor deposition or mold injection, to ensure that the passivation layer has a predetermined thickness.

The passivation layer is made from silicon oxide (SiO2), alumina (Al2O3) and the like organic component particles, or resin organic coating. Specifically, if the protection layer 501 includes an organic material, the properties of the material may be modified by changing the ratio of different organic resins, for example, strength and the like. After the properties of the material are modified, as described above, the predetermined thickness of the protection layer may also be adjusted according to the different properties of the material.

When the protection layer 501 is formed by the vapor deposition process, since the vapor deposition process is a process of physical and chemical reactions in the vapor phase, a functional or decorative metal, non-metal or compound coating is formed on the upper surface of the fingerprint sensing region 101, the material components only includes inorganic components, but do not include organic components.

Specifically, after the protection layer 501 is formed by different processes, the physical property and appearance feature of the protection layer 501 are compatible with the physical property and appearance feature of the plastic package 504 in the package structure of the fingerprint chip. In terms of compatibility of the appearance feature, the color of the protection layer 501 may be the same as or close to the color of the plastic package 504. Specifically, when the plastic package 504 is an EMC plastic package, the color of the protection layer 501 may be black, gray or the like that is close to the color of the EMC plastic package. In terms of compatibility of the physical property, the material of the protection layer 501 and the material of the plastic package 504 have the same or close expansion coefficient and contraction strength, such that when the usage environment of the fingerprint identification chip 1 changes, the protection layer 501 and the plastic package 504 are constantly in good contact.

The predetermined thickness of the protection layer 501 is determined based on a plurality of factors, for example, the identification distance of the fingerprint identification chip 1 before packaging, the predefined identification distance of the fingerprint identification chip 1, the material of the protection layer 501, the application environment of the protection layer and the like. The smaller the predefined fingerprint identification distance of the fingerprint identification chip 1, the greater the thickness of the protection layer 501. The greater the hardness of the protection layer 501, the smaller the thickness of the protection layer 501, and the less abrasiveness or scratch. When the protection layer 501 is directly used as a working surface in direct contact with a finger, the desired thickness of the protection layer 501 is greater. After the protection layer 501 is additionally provided with a cover, when the cover is used as a working surface in direction contact with the finger, the desired thickness of the protection layer 501 is smaller.

Specifically, in this embodiment, the package structure further includes a plastic package 504. The plastic package 504 is arranged on the substrate 505 and surrounds the fingerprint identification chip 1.

The plastic package 504 may be made from an epoxy molding compound (EMC), and the plastic package 504 surrounds the fingerprint chip and is molded by cross-linking curing, and thus provides protections for the side surface of the fingerprint identification chip 1.

Specifically, theoretically, an upper surface of the plastic package 504 and an upper surface of the protection layer 501 are in the same horizontal plane for the convenience of subsequent processing. However, in the practical process, the protection layer 501 and the plastic package 504 are separately formed on the fingerprint identification chip 1 by different process steps. As a result, the protection layer 501 and the plastic package 504 may not be necessarily in the same horizontal plane. In this case, a height difference between the protection layer 501 and the plastic package 504 may be about 5 μm.

The above embodiments only give exemplary description by using the chip-exposed packaging or substrate 505-type packaging upon completion of packaging as an example. However, the packaging of the fingerprint identification chip 1 further includes a frame-type package product. The frame-type package product is similar to the substrate 505-type packaging, which is thus not described herein any further.

The protection layer of the fingerprint identification chip 1 provides protections for the fingerprint identification chip 1 in fabrication processes such as downstream module assembling and the like upon completion of packaging. However, upon completion of the fabrication processes such as downstream module assembling and the like, the fingerprint identification chip 1 may be put into use. In this case, sufficient protections also need to be provided for the fingerprint identification chip 1.

Figure 7:
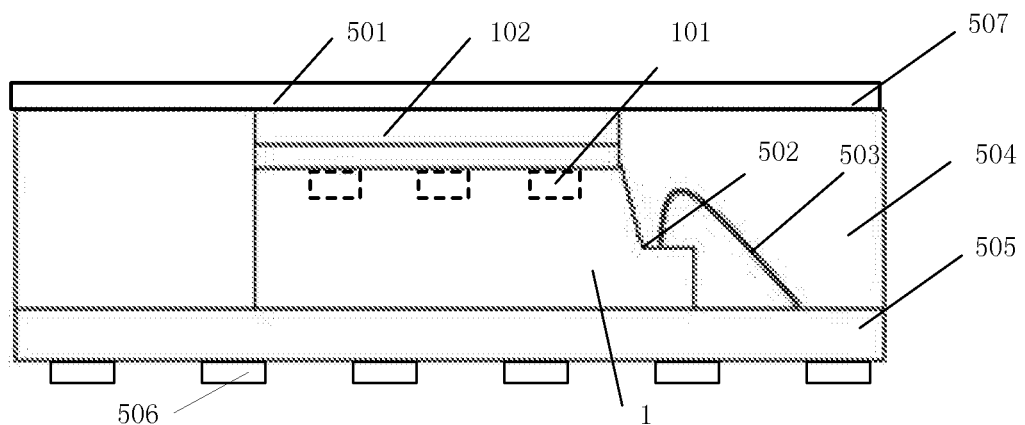
FIG. 7 is a schematic structural view of a fingerprint identification module according to an embodiment of the present application.

In another embodiment of the present application, as illustrated in FIG. 7, upon completion of packaging of the fingerprint identification chip 1, a cover 507 may also be arranged over the protection layer. The cover 507 is attached to the protection layer via a resin adhesive. The cover 507 is used as a working surface in contact with a finger. In this case, the passivation layer is a high surface energy passivation layer that is adaptive to the resin adhesive. The surface energy is a unit for measuring the energy on the surface of a solid. The passivation layer having a high surface energy is strongly attached to the adhesive, such that the bonding of the passivation layer and the resin adhesive is more compact.

In this embodiment, when the cover is used as the working surface in contact with the finger during the use of the fingerprint identification chip 1, the cover 507 needs to have sufficient hardness to provide sufficient protections for the fingerprint identification chip 1 during the use. Specifically, the cover 507 may be made from glass, sapphire or ceramic.

Alternatively, during the use, the protection layer is directly used as the working surface in contact with the finger. During the use, if sufficient protections need to be provided for the fingerprint identification chip 1, the protection layer needs to have sufficient hardness, thickness and good oleophobic property, hydrophobic property, dust-resistant property, and scratch resistance property. The property of the protection layer may be practiced by using different passivation materials. In addition, during the process of forming the protection layer, machining is carried out such that the protection layer has a specific micro structure, for example, a nano-scale protrusion shape or an increased nano-scale spacing between the protrusions and the like. The strength, oleophobic property, hydrophobic property and the like of the protection layer of the fingerprint identification chip 1 are enhanced by using the micro structure.

The above described device embodiments are merely for illustration purpose only. The modules which are described as separate components may be physically separated or may be not physically separated, and the components which are illustrated as modules may be or may not be physical modules, that is, the components may be located in the same position or may be distributed into a plurality of network modules. A part or all of the modules may be selected according to the actual needs to achieve the objectives of the technical solutions of the embodiments. Persons of ordinary skill in the art may understand and implement the present application without paying any creative effort.

According to the above embodiments of the present application, a person skilled in the art may clearly understand that the embodiments of the present application may be implemented by means of hardware or by means of software plus a necessary general hardware platform. Based on such understanding, portions of the technical solutions of the present application that essentially contribute to the related art may be embodied in the form of a software product, the computer software product may be stored in a storage medium, such as a ROM/RAM, a magnetic disk, a CD-ROM and the like, including several instructions for causing a computer device (a personal computer, a server, or a network device) to perform the various embodiments of the present application, or certain portions of the method of the embodiments.

Finally, it should be noted that the above embodiments are merely used to illustrate the technical solutions of the present application rather than limiting the technical solutions of the present application. Although the present application is described in detail with reference to the foregoing embodiments, persons of ordinary skill in the art should understand that they may still make modifications to the technical solutions described in the above embodiments, or make equivalent replacements to some of the technical features; however, such modifications or replacements do not cause the essence of the corresponding technical solutions to depart from the spirit and scope of the technical solutions of the embodiments of the present application.

What is claimed is:

1. A fingerprint identification module, comprising:
a fingerprint identification chips; and
a package structure for packaging the fingerprint identification chip;
wherein a fingerprint sensing region of the fingerprint identification chip is exposed outside the package structure, the package structure further comprising:
a film layer arranged on an upper surface of the fingerprint sensing region, wherein the film layer is made from lamination of two materials of silicon dioxide and silicon nitride, and has a thickness between 1 and 3 µm;
a protection layer with a predetermined thickness is provided on an upper surface of the film layer of the fingerprint sensing region, and the protection layer is configured to protect the fingerprint sensing region exposed outside the package structure and cause the fingerprint identification chip to have a predefined fingerprint identification distance, and
a plastic package arranged on a substrate and surrounding the fingerprint identification chip, wherein an upper surface of the plastic package and an upper surface of the protection layer are in the same horizontal plane,
wherein both the protection layer and the plastic package are made from epoxy molding compound formed by a mold injection process such that expansion coefficient and contraction strength of the protection layer approximate expansion coefficient and contraction strength of the plastic package.

2. The fingerprint identification module according to claim 1, further comprising: a solder ball array electrically connected to an external circuit; wherein the solder ball array is arranged under the fingerprint identification chip and is electrically connected to a through-silicon via structure of the fingerprint identification chip via a solder pad on a lower surface of the fingerprint identification chip, such that the fingerprint identification chip is electrically connected to the external circuit.

3. The fingerprint identification module according to claim 2, wherein a substrate is arranged under the solder ball array, a contact array is arranged under the substrate, and the solder ball array is electrically connected to the external circuit via the contact array.

4. The fingerprint identification module according to claim 1, wherein a solder pad is arranged on a lower surface of the fingerprint identification chip, a substrate is arranged under the solder pad, a trench structure causes the fingerprint identification chip to be electrically connected to a circuit on the solder pad being arranged on the fingerprint identification chip, a contact array is electrically connected to a peripheral circuit being arranged under the substrate, and the solder pad is electrically connected to the contact array such that the fingerprint identification chip is electrically connected to the peripheral circuit via the contact array.

5. The fingerprint identification module according to claim 1, wherein the protection layer is a passivation layer.

6. The fingerprint identification module according to claim 5, wherein the passivation layer is an organic passivation layer or inorganic passivation layer having a dielectric function.

7. The fingerprint identification module according to claim 6, wherein the passivation layer has a dielectric constant of being greater than 3.

8. The fingerprint identification module according to claim 5, wherein the passivation layer has a thickness of 10 to 20 µm.

9. The fingerprint identification module according to claim 5, wherein a cover is arranged above the passivation layer, the cover is bonded to the passivation layer and used as a working surface for a finger to contact.

10. The fingerprint identification module according to claim 9, wherein the cover is bonded to the passivation layer via a resin-based adhesive, and the passivation layer is a high surface energy passivation layer that is adaptive to the resin-based adhesive.

11. The fingerprint identification module according to claim 5, wherein the passivation layer is directly used as a working surface for a finger to contact.

12. The fingerprint identification module according to claim 1, wherein the finger-print identification chip comprises any one of a bare chip, a wafer chip and a package chip.

13. The fingerprint identification module according to claim 1, wherein the package structure comprises a chip-exposed package structure, a substrate-type package structure and a frame-type package structure.

14. A package structure of a fingerprint identification chip, wherein a fingerprint sensing region of the fingerprint identification chip is exposed outside the package structure, the package structure comprising:
    a film layer arranged on an upper surface of the fingerprint sensing region, wherein the film layer is made from lamination of two materials of silicon dioxide and silicon nitride, and has a thickness between 1 and 3 µm;
    a protection layer with a predetermined thickness is arranged on an upper surface of the film layer of the fingerprint sensing region, and the protection layer protects the fingerprint sensing region exposed outside the package structure and causes the fingerprint identification chip to have a predefined fingerprint identification distance, and
    a plastic package arranged on a substrate and surrounding the fingerprint identification chip, wherein an upper surface of the plastic package and an upper surface of the protection layer are in the same horizontal plane,
    wherein both the protection layer and the plastic package are made from epoxy molding compound formed by a mold injection process such that expansion coefficient and contraction strength of the protection layer approximate expansion coefficient and contraction strength of the plastic package.

* * * * *